United States Patent [19]

Ohkawa et al.

[11] Patent Number: 4,790,968
[45] Date of Patent: Dec. 13, 1988

[54] PROCESS FOR PRODUCING PRESSURE-SENSITIVE ELECTROCONDUCTIVE SHEET

[75] Inventors: Kazuhiro Ohkawa, Ohta; Tarou Yamazaki, Yokohama, both of Japan

[73] Assignee: Toshiba Silicone Co., Ltd., Japan

[21] Appl. No.: 916,338

[22] Filed: Oct. 7, 1986

[30] Foreign Application Priority Data

Oct. 19, 1985 [JP] Japan .................. 60-232338
Oct. 19, 1985 [JP] Japan .................. 60-232339

[51] Int. Cl.$^4$ .............. B29C 67/08; B05D 5/12; H01C 10/10; H01H 1/06
[52] U.S. Cl. ................... 264/104; 264/132; 264/135; 264/137; 264/257; 200/264; 338/99; 427/96
[58] Field of Search .......... 264/104, 132, 257; 200/264; 427/96; 338/99

[56] References Cited

U.S. PATENT DOCUMENTS

| | | | |
|---|---|---|---|
| 4,143,179 | 3/1979 | Hishikata et al. | 427/58 |
| 4,180,711 | 12/1979 | Hirata et al. | 200/5 A |
| 4,199,637 | 4/1980 | Sado | 338/99 |
| 4,252,391 | 2/1981 | Sado | 338/99 |
| 4,324,815 | 4/1982 | Mitani et al. | 427/96 |
| 4,348,557 | 9/1982 | Sado | 200/5 A |
| 4,440,944 | 4/1984 | Fretz Jr. et al. | 560/76 |
| 4,442,055 | 4/1984 | Oelsch et al. | 264/105 |
| 4,518,764 | 5/1985 | Tanaka et al. | 528/271 |
| 4,527,021 | 7/1985 | Morikawa et al. | 200/264 |
| 4,715,235 | 12/1987 | Fukui et al. | 338/99 |

FOREIGN PATENT DOCUMENTS

| | | |
|---|---|---|
| 52-073399 | 6/1977 | Japan . |
| 52-125796 | 10/1977 | Japan . |
| 53-000897 | 1/1978 | Japan . |
| 59-098164 | 6/1984 | Japan . |
| 61-110488 | 5/1986 | Japan . |
| 61-107792 | 5/1986 | Japan . |
| 61-107793 | 5/1986 | Japan . |

Primary Examiner—Jan H. Silbaugh
Assistant Examiner—Neil M. McCarthy

[57] ABSTRACT

A process (I), for producing a pressure-sensitive electroconductive sheet by (A), forming conductive circuits or electrodes in a flexible porous substrate and (B), applying, followed by curing a pressure-sensitive conductive paste to either or both sides of the substrate to form a pressure-sensitive conductive layer; and a process (II) for producing a pressure-sensitive electroconductive sheet by (A), forming conductive circuits or electrodes in a flexible porous subhstrate, (B), subsequently applying, followed by curing, a pressure-sensitive conductive paste to either side of the substrate to form a pressure-sensitive conductive layer, and (C), applying, followed by curing, insulating silicone rubber to the side of the substrate on which the pressure-sensitive conductive layer is not formed to form an insulating silicone rubber layer.

15 Claims, 2 Drawing Sheets

PROCESS FOR PRODUCING PRESSURE-SENSITIVE ELECTROCONDUCTIVE SHEET

The present application claims priority of Japanese Patent Application Serial No. 60-232338 and No. 60-232339 both filed on Oct. 19, 1985.

BACKGROUND OF THE INVENTION

Field of the Invention:

The present invention relates to a process for producing a pressure-sensitive electroconductive sheet which is used as a switch element for electronic machines and equipment. More particularly, it is concerned with a process for producing a pressure-sensitive electroconductive sheet, with the switching conductor circuits and electrodes contained in the sheet, the sheet having superior conductivity, resolution, and durability.

Description of the Prior Art:

Pressure-sensitive conductive rubber sheets have been in general use as a switching element (member) for the keyboard of electronic machines and equipment. Such sheets are produced by dispersing metal particles into insulating rubber. If the degree of dispersion is properly controlled, the metal particles come into contact with one another upon application of a threshold pressure forming conductive paths and making the rubber electrically conductive. Otherwise, the rubber retains its high resistance as an insulator when it is not under pressure.

The conventional pressure-sensitive conductive rubber sheet is produced by several processes. According to the process disclosed in Japanese Patent Publication Kokai No. 52-73399, conductive metal particles previously surface-treated with a rubberlike insulating binder are incorporated and dispersed into a polymeric elastomer, and the filled elastomer is formed into a sheet. According to the process disclosed in Japanese Patent Publication Kokai No. 52-125796, conductive particles previously treated with a silane coupling agent are dispersed into a polymeric elastomer and the filled elastomer is formed into a sheet. According to the process disclosed in Japanese Patent Publication Kokai No. 53-897, magnetic metal particles are dispersed into an elastomer and the filled elastomer is formed into a sheet in a parallel magnetic field so that the magnetic metal particles are regularly arranged. Thus, the pressure-sensitive conductive rubber sheet produced by the above process varies greatly in resistance when subjected to pressure and it also works with a low pressure.

In the case of conventional pressure-sensitive conductive sheet, silicone rubber is used as the binder into which conductive particles are dispersed. This is because silicone rubber has good resilience and environmental resistance. On the other hand, silicone rubber is poor in mechanical strength, and this shortcoming leads to the poor durability of pressure-sensitive conductive rubber sheet. At ordinary levels of mechanical strength, the conventional pressure-sensitive conductive rubber sheet is required to have a thickness of 0.5 to 1 mm. Such a thick sheet is not suitable as a switch element for electronic parts which are becoming lighter and thinner.

Another disadvantage of the conventional pressure-sensitive electroconductive sheet is that the sheet has to be cut into a proper shape according to the circuit electrode before it is used as a switch element for electronic parts. This cutting step is inconvenient and difficult.

SUMMARY OF THE INVENTION

The present invention was completed to eliminate the above-mentioned disadvantages. It is an object of the present invention to provide a process for producing a pressure-sensitive electroconductive sheet containing internal switching conductor circuits which is superior in conductivity, resolution, and durability and which is thin but yet has high strength.

DETAILED DESCRIPTION OF THE INVENTION

Figure 1:
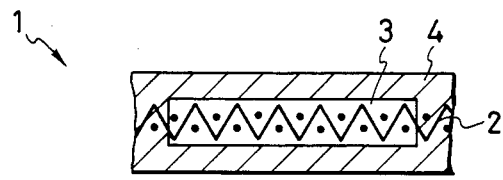
FIG. 1 is a sectional view of the pressure-sensitive electroconductive sheet produced in Example 1 of this invention.

The present invention provides [I] a process for producing a pressure-sensitive electroconductive sheet which comprises (A) a step of forming conductive circuits or electrodes in a flexible porous substrate and (B) a subsequent step of applying, followed by curing, a pressure-sensitive conductive paste to either or both sides of said substrate, thereby forming a pressure-sensitive conductive layer; and also provides [II] a process for producing a pressure-sensitive electroconductive sheet which comprises (A) a step of forming conductive circuits or electrodes in a flexible porous substrate, (B) a subsequent step of applying, followed by curing, a pressure-sensitive conductive paste to either side of said substrate, thereby forming a pressure-sensitive conductive layer, and (C) a step of applying, followed by curing, insulating silicone rubber to that side of said substrate on which the pressure-sensitive conductive layer is not formed, thereby forming an insulating silicone rubber layer.

The flexible porous substrate used in this invention includes porous resin film, woven fabrics, and nonwoven fabrics. They are required to be flexible and porous enough to permit the ink or coating material applied to one side to permeate to the opposite side. Permeation helps form a coating layer of good adhesion. Nonwoven fabrics are preferable from the standpoint of thickness uniformity and material cost. Preferred nonwoven fabrics are made from glass, polyester, polyamide, or polyacetal. The last three are suitable where flexibility is important.

The substrate of nonwoven fabric may be made of short fibers or continuous filaments. Preferably, it should have a thickness of 15 to 300 μm and a density of 0.2 to 0.7 g/cm$^3$ so that it permits ink or coating material to permeate to the opposite side, forming a coating layer of good adhesion. The fineness of the fiber should preferably be smaller than 20 μm. For sufficient tensile strength, continuous filaments are preferable, and for uniform thickness, shot fibers are preferable. Choice depends on application, and they may be used in combination.

In step (A) of process [I] or [II], the conductor circuits or electrodes are formed in the flexible porous substrate. This step is easily accomplished by screen printing or electroless plating which were proposed by the present inventors in Japanese Patent Publication Kokai No. 61-107792, 61-107793, and 61-110488. Other methods of forming the conductive film include spattering, glazing, and thermal spraying.

The preferred method is screen printing with a conductive paste containing one or more of silver, copper, and carbon. Screen printing needs no special equipment and can form conductor circuits or electrodes of any shape desired.

In step (B), the pressure-sensitive conductive layer is formed on either or both sides, process [I], or on one side, process [II], of the substrate in which the conductor circuits or electrodes have been made. This step is accomplished by applying a pressure-sensitive conductive paste, followed by curing. This paste should be capable of curing at normal temperature or upon heating or exposure to light. In addition, it should exhibit rubberiness after curing and it should have good workability, good heat resistance, good durability, and good adhesion to the substrate. These requirements are satisfied by a silicone composition which is a paste in the uncured state and contains one or more kinds of conductive particles such as silver, copper, nickel, platinum, plated noble metal, and carbon and optionally nonconductive filler dispersed therein.

A preferred paste of silicone composition is composed of polyorganosiloxane which becomes rubbery upon curing and surface-treated conductive metal powder dispersed therein. This composition is superior in dispersion. The best results are obtained with a composition comprising the above-mentioned polyorganosiloxane and metal powder (e.g., nickel powder) surface-treated with a platinum compound. (This composition was found by the present inventors and is disclosed in Japanese Patent Publication Kokai No. 59-98164). This composition is superior in that resistance varies greatly depending on the actuating pressure, and is also superior in anisotropism and high resolution. When in the uncured state, this composition is flowable or thixotropic. It may be diluted with a solvent so that it has a proper flow for screen printing.

The thickness of the pressure-sensitive conductive layer should be 10 to 200 μm, preferably 30 to 60 μm, from the standpoint of pressure-sensitive conductivity and coating workability.

According to the above-mentioned process [I] of this invention, the pressure-sensitive conductive layer is formed all over the substrate in which conductor circuits or electrodes have been formed or on the limited surface of the substrate corresponding to the electrodes. Process [I] of producing the pressure-sensitive electroconductive sheet is completed by combining step (A) and step (B).

According to the above-mentioned process [II] of this invention, the pressure-sensitive conductive layer may be formed all over one surface of the substrate in which conductor circuits or electrodes have been formed, or only on that part of the surface which corresponds to the electrodes.

In step (C), an insulating silicone rubber layer is formed to impart additional flexibility and strength to the pressure-sensitive electroconductive sheet of this invention. The insulating silicone rubber is a paste in its uncured state, and it can be easily applied by screen printing. It can be applied as such or after dilution with a solvent. Application without dilution is advantageous to the accurate thickness control of the insulating silicone rubber layer.

The insulating silicone rubber layer may be formed entirely or partly on the surface on which the pressure-sensitive conductive layer is not formed. The thickness of the insulating silicone rubber layer is not specifically limited; but it may be properly selected according to the method of application.

The process [II] of producing the pressure-sensitive electroconductive sheet is completed by combining step (A), step (B), and step (C).

The pressure-sensitive electroconductive sheet produced according to the above-mentioned process of this invention has the following advantages. The sheet is thin and yet has high strength because the flexible porous substrate is reinforced with the pressure-sensitive conductive paste or insulating silicone rubber which permeate the substrate and cure in the substrate. The pressure-sensitive conductive layer and insulating silicone rubber layer are formed after the conductor circuits and electrodes have been formed in the flexible porous substrate, therefor the conductor circuits and electrodes are contained in a sheet, and this simplifies the switch assembling work. The pressure-sensitive electroconductive sheet is superior in conductivity, resolution, and durability.

EXAMPLES OF THE INVENTION

The invention will be described in more detail with reference to the following examples, which should not be construed as restricting the scope of the invention. In Examples and Reference Examples, quantities are expressed in terms of parts by weight.

Reference Example 1

(Preparation of conductive metal powder treated with a platinum compound)

To 100 parts of nickel powder having an average particle diameter of 3 to 7 μm obtained from nickel carbonyl was added 100 parts of 1 wt % xylene solution of vinylsiloxane-coordinated platinum complex. The mixture was refluxed with heating and stirring. Four hours later, the complex-treated powder was filtered off and washed, followed by heating at 150° C. for 2 hours. Thus there was obtained nickel powder treated with platinum-siloxane complex.

Reference Example 2

(Preparation of pressure-sensitive conductive silicone rubber paste)

To 100 parts of addition cured type silicone rubber composition (TSE 3221: trade name, produced by Toshiba Silicone Co., Ltd.) was added 300 parts of the nickel powder treated with platinum-siloxane complex as obtained in Reference Example 1. After preliminary mixing by a small blender, dispersion was accomplished by the use of a three-roll mill. Thus there was obtained a pressure-sensitive conductive silicone rubber composition. For viscosity adjustment, 100 parts of the composition was diluted with 1.5 parts of solvent (Hi-Arom 2S: trade name, produced by Nippon Oil Co., Ltd.). Thus there was obtained a pressure-sensitive conductive silicone rubber paste.

EXAMPLE 1

A conductive paste of the following composition was prepared.
(1) 40 parts of flaky silver powder: TCG-7 (trade name, produced by Tokuriki Kagaku Kenkyusho Co., Ltd.)
(2) 42.5 parts of colloidal silver powder: E-20 (trade name, produced by Tokuriki Kagaku Kenkyusho Co., Ltd.)
(3) 2.5 parts of graphite powder: KS-2.5 (trade name, produced by Lonza Co., Ltd.)
(4) 50 parts of polyurethane resin Adeka Bontiter UCX 904 (trade name, produced by Asahi Denka Kogyo K.K.)
(5) 1 part of stearate Armide OF (trade name, produced by Lion Corp.)
(6) 1 part of titanium coupling agent: Prenact TTS (trade name, produced by Ajinomoto Co., Inc.)
(7) 2.5 parts of curing agent for polyurethane Sumidule N75 (trade name, produced by Sumitomo Bayer Co., Ltd.)

The conductive paste was applied by screen printing technique to a nonwoven fabric of polyester monofilaments: Nonwoven fabric No. 2 (trade name, produced by Daifuku Seishi Co., Ltd.). The area of application was 100 mm by 100 mm. After heating at 140° C. for 30 minutes, there were formed firm conductive layers on both sides of the nonwoven fabric.

On the other hand, the pressure-sensitive conductive silicone rubber paste obtained in Reference Example 2 was applied by screen printing technique to a polytetrafluoroethylene plate. The area of application was 110 mm by 110 mm. Screen printing was carried out by using a 150-mesh, 120-μm thick polyester screen. On the printed surface of the pressure-sensitive conductive paste was placed the above-mentioned nonwoven fabric on which the conductive layer had previously been formed, so that the conductive layer and the pressure-sensitive conductive layer overlap with each other. The pressure-sensitive conductive paste was applied again to the conductive layer on the nonwoven fabric by screen printing in the same manner as mentioned above. The screen-printed nonwoven fabric together with the polytetrafluoroethylene plate were heated at 150° C. for 30 minutes to effect curing. The polytetrafluoroethylene plate was removed from the nonwoven fabric.

The thus produced pressure-sensitive electroconductive sheet has the structure as shown in FIG. 1, in which there is shown the nonwoven fabric (2) having therein the conductive layer (3) and there are shown the pressure-sensitive conductive layers (4) formed on both sides of the conductive layer (3). The total thickness of the layers is 150 μm.

Figure 2:
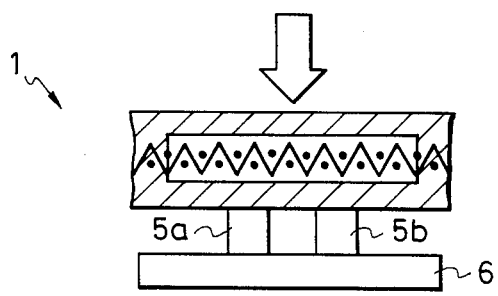
FIG. 2 is a sectional view illustrating how to test the switching characteristics in this invention.

To evaluate the switching characteristics, the pressure-sensitive electroconductive sheet (1) was placed on the board (6) on which are formed the comb-type electrodes (5a and 5b), as illustrated by a sectional view in FIG. 2. The insulation resistance between the comb-type electrodes (5a) and (5b) was measured when no pressure was applied. The conduction resistance between the comb-type electrodes (5a) and (5b) thru the sheet (1) was measured when pressure was applied in the direction of arrow with a silicone rubber rod, 8 mm in diameter, having a hardness of 40. The minimum pressure to make the path between the comb-type electrodes (5a) and (5b) thru the sheet (1) conductive was measured.

The evaluation of the switching characteristics was performed at arbitrarily selected five positions on each side of the sheet. The results are shown in Table 1.

TABLE 1

| Positions for measurement | 1 | | 2 | | 3 | | 4 | | 5 | |
|---|---|---|---|---|---|---|---|---|---|---|
| | Front | Back | Front | Back | Front | Back | Front | Back | Front | Back |
| Inslation resistance (MΩ) | more than 100 | more than 100 | more than 100 | more than 100 | more than 100 | more than 100 | more than 100 | more than 100 | more than 100 | more than 100 |
| Conduction resistance (Ω) | 10 | 10 | 15 | 10 | 20 | 15 | 10 | 10 | 15 | 10 |
| Actuating force (g) | 50 | 30 | 50 | 30 | 50 | 30 | 50 | 30 | 50 | 30 |

The pressure-sensitive electroconductive sheet obtained in this example was examined for tensile strength. The results are shown in Table 2, together with the data of two kinds of commercial pressure-sensitive electroconductive sheets.

TABLE 2

| | Example 1 | | Comparative | |
|---|---|---|---|---|
| | Parallel to direction in which fibers are oriented | Perpendicular to direction in which fibers are oriented | 1 | 2 |
| Thickness (mm) | 0.15 | 0.15 | 1.0 | 0.5 |
| Tensile strength (kg/cm²) (unit) | 70 | 28 | 15 | 7 |

With the pressure-sensitive electroconductive sheet placed on the comb-type electrode as shown in FIG. 2, a pressure of 200 g was repeatedly applied three million times at an interval of 0.25 second. The sample was examined for switching characteristics. Almost no change was noticed after the repeated application of pressure.

EXAMPLE 2

Experiments were carried out with the same nonwoven fabric, conductive paste, and pressure-sensitive conductive paste as in Example 1.

Figure 3:
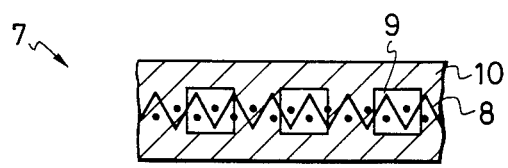
FIG. 3 is a sectional view of the pressure-sensitive electroconductive sheet produced in Example 2 of this invention.

The conductive paste was applied to the nonwoven fabric (8) to form the checker-patterned electrode (9), 0.5 mm wide and 3 mm apart, as shown in FIG. 3.

On the other hand, the pressure-sensitive conductive paste was applied by screen printing technique to a polytetrafluoroethylene plate. The area of application was 100 mm by 100 mm. Screen printing was carried out by using a 150-mesh, 120-μm thick polyester screen. On the printed surface of the pressure-sensitive conductive paste was placed the above-mentioned nonwoven fabric (8) in which the checker-patterned electrode (9) had previously been formed. The pressure-sensitive conductive paste was applied again to the nonwoven fabric (8) by screen printing. The screenprinted nonwoven fabric together with the polytetrafluoroethylene plate were heated for curing in the same manner as in Example 1. Thus there was obtained the pressure-sensitive electroconductive sheet (7) composed of the nonwoven fabric (8) and the pressure-sensitive conductive layer (10) formed thereon.

The thus produced pressure-sensitive electroconductive sheet was found to have a tensile strength of 70 kg/cm² in the direction parallel to the direction in which fibers are oriented and a tensile strength of 25 kg/cm² in the direction perpendicular to the direction in which fibers are oriented.

The pressure-sensitive electroconductive sheet was examined for switching characteristics and deterioration after repeated pressure application. The results were similar to those in Example 1.

EXAMPLE 3

The substrate of nonwoven fabric was coated with a conductive paste to form conductive layers on both sides of the nonwoven fabric, by using the same materials and processes as in Example 1.

The pressure-sensitive conductive silicone rubber paste obtained in Reference Example 2 was applied to one of the conductive layers by screen printing with a 150-mesh, 120-μm thick polyester screen. The paste was cured by heating at 150° C. for 30 minutes. Thus there was obtained a 40-μm thick pressure-sensitive conductive layer. (The area of the pressure-sensitive conductive layer was equal to that of the conductive layer.)

To the other conductive layer on the nonwoven fabric was applied insulating silicone rubber paste: TSE 3360 (trade name, produced by Toshiba Silicone Co., Ltd.) by screen printing, followed by heating at 150° C. for 30 minutes. (The area of screen printing was equal to that of the conductive layer.)

Figure 4A:
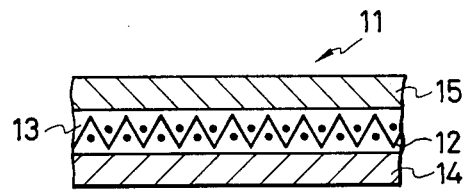
FIG. 4(a) is a sectional view of the pressure-sensitive electroconductive sheet produced in Example 3 of this invention.

The thus produced pressure-sensitive electroconductive sheet (11) was 100 mm by 100 mm in size and 150 μm in thickness. It is composed of the nonwoven fabric (12) having therein the conductive layer (13), the pressure-sensitive conductive layer (14) formed on the under side, and the insulating silicone rubber layer (15) formed on the upper side, as shown in FIG. 4(a) (sectional view) and FIG. 4(b) (plan view).

Figure 5:
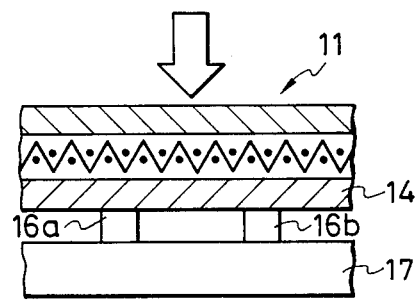
FIG. 5 is a sectional view showing the structure of the switch used for the measurement of switching characteristics in Example 3 of this invention.

To evaluate the switching characteristics, the pressure-sensitive electroconductive sheet (11) was placed on the board (17) on which are formed the comb-type electrodes (16a and 16b), with the pressure-sensitive conductive layer (14) of the pressure-sensitive electroconductive sheet (11) in contact with the comb-type electrodes (16a and 16b), as illustrated by a sectional view in FIG. 5. The insulation resistance between the comb-type electrodes (16a) and (16b) was measured when no pressure was applied. The conduction resistance between the comb-type electrodes (16a) and (16b) thru the sheet (11) was measured when pressure was applied in the direction of arrow with a silicone rubber rod, 8 mm in diameter, having a hardness of 40. The minimum pressure to make the sheet (11) conductive between the comb-type electrodes (16a) and (16b) was measured.

Figure 4B:
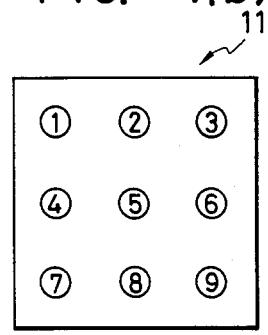
FIG. 4(b) is a plan view of the same.

The evaluation of the switching characteristics was performed at nine positions on the sheet as shown in FIG. 4(b). The results are shown in Table 3.

TABLE 3

| Positions for measurement | 1 | 2 | 3 | 4 | 5 | 6 | 7 | 8 | 9 (unit) |
|---|---|---|---|---|---|---|---|---|---|
| Insulation resistance (MΩ) | more than 100 | more than 100 | more than 100 | more than 100 | more than 100 | more than 100 | more than 100 | more than 100 | more than 100 |
| Conduction resistance (Ω) | 15 | 10 | 10 | 20 | 15 | 15 | 10 | 10 | 10 |
| Actuating force (g) | 50 | 50 | 50 | 50 | 50 | 50 | 50 | 50 | 50 |

The pressure-sensitive electroconductive sheet obtained in this example was examined for tensile strength. The results ae shown in Table 4, together with the data of two kinds of commercial pressure-sensitive electroconductive sheets.

TABLE 4

| | Example 3 | | Comparative | |
|---|---|---|---|---|
| | Parallel to direction in which fibers are oriented | Perpendicular to direction in which fibers are oriented | 1 | 2 |
| Thickness (mm) | 0.15 | 0.15 | 1.0 | 0.5 |
| Tensile strength (kg/cm²) (unit) | 100 | 40 | 15 | 7 |

EXAMPLE 4

Figure 6:
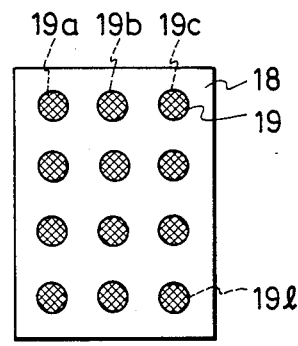
FIG. 6 is a plan view of the substrate on which electrodes are formed by the process (A) in Example 4 of this invention.
Figure 7:
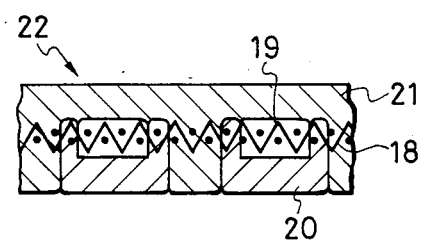
FIG. 7 is a sectional view of the pressure-sensitive electroconductive sheet produced in Example 4 of this invention.

Twelve circular electrodes (19), each 6 mm in diameter, were formed by applying the conductive paste to the nonwoven fabric (18) as shown in FIG. 6. (The conductive paste and nonwoven fabric are the same as those used in Example 1.)

Then, the same pressure-sensitive conductive paste as used in Example 1 was applied by screen printing technique to one side of each of the electrodes (19). The pattern of screen printing was a circle 8 mm in diameter which covers each electrode. After curing with heating at 150° C. for 30 minutes, there was obtained the pressure-sensitive conductive layer (20), 40 μm thick.

Figure 8:
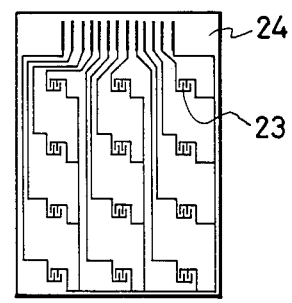
FIG. 8 is a plan view of the conductor curcuit board used for the measurement of switching characteristics in Example 4 of this invention.

Insulating silicone rubber paste (TSE 3360) was applied by screen printing technique to the back of the nonwoven fabric (18) on which were formed the pressure-sensitive conductive layer (20). The pattern of screen printing was a rectangle, 60 mm by 80 mm. A portion of the rubber paste applied penetrated the nonwoven fabric to fill the area not occupied by the circles of the pressure-sensitive conductive layer (20) on the front side of the nonwoven fabric. After curing with heating at 150° C. for 30 minutes, there was obtained the pressue-sensitive electroconductive sheet (22) To evaluate the switching characteristics of the twelve contacts (19a to 19l), the pressure-sensitive electroconductive sheet (22) was placed on the conductor circuit board (24) on which are formed the comb-type electrodes (23), with the pressure-sensitive conductive layer (20) thereof in contact with the comb-type electrodes (23), as shown in FIG. 8. A pressure of 200 g was repeatedly applied three million times at an interval of 0.25 second. The results are shown in Table 5.

TABLE 5

| | Initial | | | After 3 million pressings | | |
|---|---|---|---|---|---|---|
| Contact | Insulation resistance (M $\Omega$) | Conduction resistance ($\Omega$) | Actuating force (g) | Insulation Resistance (M $\Omega$) | Conduction Resistance ($\Omega$) | Actuating force (g) |
| 19a | more than 100 | 10 | 50 | more than 100 | 15 | 50 |
| 19b | 100 | 10 | 50 | 100 | 10 | 50 |
| 19c | 100 | 10 | 50 | 100 | 15 | 50 |
| 19d | 100 | 15 | 50 | 100 | 15 | 50 |
| 19e | 100 | 10 | 50 | 100 | 20 | 50 |
| 19f | 100 | 15 | 50 | 100 | 15 | 50 |
| 19g | 100 | 10 | 50 | 100 | 15 | 50 |
| 19h | 100 | 20 | 50 | 100 | 20 | 50 |
| 19i | 100 | 20 | 50 | 100 | 20 | 50 |
| 19j | 100 | 10 | 50 | 100 | 10 | 50 |
| 19k | 100 | 10 | 50 | 100 | 15 | 50 |
| 19l | 100 | 15 | 50 | 100 | 15 | 50 |

What is claimed is:

1. A process for producing a pressure-sensitive electroconductive sheet which comprises (A) forming conductor circuits or electrodes in a flexible porous substrate and (B) subsequently applying, followed by curing, a pressure-sensitive conductive paste onto either or both sides of said substrate and onto those areas of said substrate in which said conductor circuits or electrodes have been, thereby forming a pressure-sensitive conductive layer.

2. A process for producing a pressure-sensitive electroconductive sheet as set forth in claim 1, wherein the flexible porous substrate is 15 to 300 μm thick.

3. A process for producing a pressure-sensitive electroconductive sheet as set forth in claim 1, wherein the flexible porous substrate is a nonwoven fabric.

4. A process for producing a pressure-sensitive electroconductive sheet as set forth in claim 1, wherein the conductor circuits or electrodes are formed by screen printing with a conductive paste.

5. A process for producing a pressure-sensitive electroconductive sheet as set forth in claim 1, wherein the application of the pressure-sensitive conductive paste is accomplished by screen printing.

6. A process for producing a pressure-sensitive electroconductive sheet as set forth in claim 1, wherein the pressure-sensitive conductive paste is one which is produced by dispersing surface-treated conductive metal powder into silicone rubber.

7. A process for producing a pressure-sensitive electroconductive sheet as set forth in claim 1, wherein the pressure-sensitive conductive layer is 10 to 200 micrometer thick.

8. A process for producing a pressure-sensitive electroconductive sheet which comprises (A) forming conductor circuits or electrodes in a flexible porous substrate, (B) subsequently applying, followed by curing, pressure-sensitive conductive paste onto either side of said substrate and onto those areas of said substrate in which said conductor circuits or electrodes have been formed, thereby forming a pressure-sensitive conductive layer, and (C) applying, followed by curing, insulating silicone rubber to that side of said substrate on which the pressure-sensitive conductive layer is not formed, thereby forming an insulating silicone rubber layer.

9. A process for producing a pressure-sensitive electroconductive sheet as set forth in claim 8, wherein the flexible porous substrate is 15 to 300 micrometer thick.

10. A process for producing a pressure-sensitive electroconductive sheet as set forth in claim 8, wherein the flexible porous substrate is a nonwoven fabric.

11. A process for producing a pressure-sensitive electroconductive sheet as set forth in claim 8, wherein the conductor circuits or electrodes are formed by screen printing with a conductive paste.

12. A process for producing a pressure-sensitive electroconductive sheet as set forth in claim 8, wherein the application of the pressure-sensitive conductive paste is accomplished by screen printing.

13. A process for producing a pressure-sensitive electroconductive sheet as set forth in claim 8, wherein the pressure-sensitive conductive paste is one which is produced by dispersing surface-treated conductive metal powder into silicone rubber.

14. A process for producing a pressure-sensitive electroconductive sheet as set forth in claim 8, wherein the pressure-sensitive conductive layer is 10 to 200 micrometer thick.

15. A process for producing a pressure-sensitive electroconductive sheet as set forth in claim 8, wherein the application of the insulating silicone rubber is accomplished by screen printing.

* * * * *